(12) United States Patent
Jeanroy et al.

(10) Patent No.: US 9,739,612 B2
(45) Date of Patent: Aug. 22, 2017

(54) SENSOR INCLUDING MOVING MASSES AND MEANS FOR DETECTING RELATIVE MOVEMENTS OF THE MASSES

(71) Applicant: Safran Electronics & Defense, Boulonge Billancourt (FR)

(72) Inventors: Alain Jeanroy, Boulonge Billancourt (FR); Philippe Onfroy, Boulonge Billancourt (FR)

(73) Assignee: Safran Electronics & Defense, Boulogne Billancourt (FR)

( * ) Notice: Subject to any disclaimer, the term of this patent is extended or adjusted under 35 U.S.C. 154(b) by 0 days.

(21) Appl. No.: 15/037,832

(22) PCT Filed: Nov. 20, 2014

(86) PCT No.: PCT/EP2014/075115
§ 371 (c)(1),
(2) Date: May 19, 2016

(87) PCT Pub. No.: WO2015/075115
PCT Pub. Date: May 28, 2015

(65) Prior Publication Data
US 2016/0290803 A1    Oct. 6, 2016

(30) Foreign Application Priority Data

Nov. 20, 2013 (FR) ..................... 13 61435

(51) Int. Cl.
*G01C 19/00* (2013.01)
*G01P 3/44* (2006.01)
(Continued)

(52) U.S. Cl.
CPC ............ *G01C 19/574* (2013.01); *B81B 3/007* (2013.01); *B81B 3/0021* (2013.01);
(Continued)

(58) Field of Classification Search
CPC .......... G01P 15/097; G01P 2015/0848; G01P 2015/0851; G01P 2015/0808; G01C 19/574; G01C 19/56; B81B 2201/025
(Continued)

(56) References Cited

U.S. PATENT DOCUMENTS 7,168,318 B2 * 1/2007 Challoner et al. . G01C 19/5684
73/504.12
7,444,868 B2 * 11/2008 Johnson ............. G01C 19/5719
73/504.12
(Continued)

FOREIGN PATENT DOCUMENTS

FR          2983574 A1    6/2013
JP         10-270715 A   10/1998
JP       2008151728 A *  7/2008

OTHER PUBLICATIONS

Bibliographic data with Abstract for JP2008151728S, Date: Jul. 3, 2008, Publisher: JPO & INPIT, pp. 1.*

*Primary Examiner* — Lisa Caputo
*Assistant Examiner* — Roger Hernandez-Prewitt
(74) *Attorney, Agent, or Firm* — Muncy, Geissler, Olds & Lowe, P.C.

(57) ABSTRACT

A MEMS type inertial sensor comprising a support structure having at least a first seismic body and a second seismic body connected thereto by resilient means in order to be movable in a suspension plane, transducers for maintaining the seismic bodies in vibration and for determining movements of the seismic bodies in the suspension plane, and a control unit connected to the transducers by electrical conductor means. The transducers comprise at least one electrode secured to the first seismic body and at least one electrode secured to the second seismic body, the two electrodes being arranged to enable relative movements of (Continued)

the seismic bodies relative to each other in the suspension plane to be measured directly.

7 Claims, 5 Drawing Sheets

(51) Int. Cl.
| | | |
|---|---|---|
| | *G01P 9/00* | (2012.01) |
| | *G01P 15/08* | (2006.01) |
| | *G01C 19/574* | (2012.01) |
| | *B81B 3/00* | (2006.01) |
| | *B81C 1/00* | (2006.01) |
| | *G01P 15/097* | (2006.01) |

(52) U.S. Cl.
CPC .. *B81C 1/00658* (2013.01); *B81B 2201/0242* (2013.01); *B81B 2201/0271* (2013.01); *B81B 2203/0109* (2013.01); *B81B 2203/04* (2013.01); *G01P 15/097* (2013.01); *G01P 2015/084* (2013.01)

(58) Field of Classification Search
USPC ........................................................ 73/504.12
See application file for complete search history.

(56) References Cited

U.S. PATENT DOCUMENTS

| | | | |
|---|---|---|---|
| 2010/0257934 A1* | 10/2010 | Zhang et al. ...... | G01C 19/5719 73/504.12 |
| 2011/0030472 A1* | 2/2011 | Aziz et al. ............ | B81B 3/0062 73/504.12 |
| 2012/0125098 A1 | 5/2012 | Ohms et al. | |

\* cited by examiner

SENSOR INCLUDING MOVING MASSES AND MEANS FOR DETECTING RELATIVE MOVEMENTS OF THE MASSES

BACKGROUND OF THE INVENTION

Field of the Invention

The present invention relates to an angular inertial sensor such as rate gyros or free gyros.

Brief Discussion of the Related Art

Such an inertial sensor comprises a support structure and seismic bodies (also known as seismic masses or test masses) that are generally arranged side by side and connected to the support structure by resilient hinges in order to be movable in a suspension plane defined by two orthogonal directions of movement for the seismic bodies. The elasticity of the hinges associated with the masses of the seismic bodies defines the frequencies of the resonant modes of the seismic bodies.

The resonator constituted by the seismic bodies and by the resilient hinges possesses two working modes of vibration, defining two directions of movement of the seismic bodies. Detecting vibration of the seismic bodies in these directions enables an angle to be measured.

The sensor also has actuators arranged to set the seismic bodies into vibration and detectors arranged to detect the relative movements of the seismic bodies. The detectors generally comprise pairs of electrodes, one of which is secured to one of the seismic bodies and the other of which is secured to the support structure. This makes it possible to detect the movements of the seismic bodies and then, by processing, to determine the movements of the seismic bodies relative to each other. Nevertheless, the measurements include components that are associated with parasitic movements between the seismic bodies and the support structure due to other resonant modes of the seismic bodies, which components can be particularly damaging for the performance of the sensor when the detectors have gains that are different.

Requirements concerning the detection of attitude and speed, e.g. for the purposes of piloting a vehicle or of navigation, require the performance of such sensors to be improved.

Various solutions have been proposed, such as for example in Document FR-A-2 983 574.

BRIEF SUMMARY OF THE INVENTION

The invention seeks to improve the performance of sensors, in particular like the above document, and can benefit from the teaching of that document, however it relies on a different approach.

The invention seeks to simplify the detection of the relative movements of the seismic bodies by limiting the processing that is needed for this purpose.

Specifically, it has been found that the processing leads to inaccuracies that degrade the performance of the sensors.

To this end, the invention provides a micro electromechanical system (MEMS) type inertial sensor comprising a support structure having at least a first seismic body and a second seismic body connected thereto by resilient means in order to be movable in a suspension plane, transducers for maintaining the seismic bodies in vibration and for determining movements of the seismic bodies in the suspension plane, and a control unit connected to the transducers by electrical conductor means. The transducers comprise at least one electrode secured to the first seismic body and at least one electrode secured to the second seismic body, the two electrodes being arranged to enable relative movements of the seismic bodies relative to each other in the suspension plane to be measured directly.

Relative movements of the seismic bodies are thus determined directly by means of electrodes secured to the seismic bodies.

The transducers preferably comprise electrodes secured respectively to the first seismic body and to the second seismic body in at least two directions parallel to the suspension plane, the electrodes being arranged to enable the movements of the seismic bodies relative to each other in the suspension plane to be measured directly.

Advantageously, the sensor includes at least a first semiconductor layer in which there are formed at least a portion of the seismic bodies, the resilient means, and the electrodes, a first electrically insulating layer, and a second semiconductor layer forming a support. The first semiconductor layer is provided with slots through its full height in order to define electrical conduction paths extending from the electrodes to the periphery of the support structure via the resilient means so as to form at least some of the conduction means.

Making conduction paths in the first semiconductor layer by using the resilient means enables measurement signals to be transmitted without having recourse to external connection means that might give rise to disturbances in the movements of the seismic bodies.

Other characteristics and advantages of the invention appear on reading the following description of particular, non-limiting embodiments of the invention.

BRIEF DESCRIPTION OF THE DRAWINGS

Reference is made to the accompanying drawings, in which.

DETAILED DISCUSSION OF THE PREFERRED EMBODIMENTS

With reference to FIGS. 1 to 5, the sensor in the first embodiment of the invention is given overall reference 1, and is a sensor of the MEMS type made from a wafer comprising two semiconductor layers 100.1 and 100.2, and an electrically insulating layer 101.1. The insulating layer 101.1 extends between the first semiconductor layer 100.1 and the second semiconductor layer 100.2. The semiconductor layers 100.1 and 100.2 are made of semiconductor material, silicon in this example, and the insulating layer 100.1 is made of a silicon oxide such as $SiO_2$.

In each semiconductor layer 100.1, 100.2, there are formed:

a support structure 2.1, 2.2 forming an outer frame;

an intermediate fame 9.1, 9.2;

seismic body portions given overall references 3.1, 3.2;

first resilient elements 8.11, 8.12 connecting the seismic body 3.1, 3.2 to the intermediate frame 9.1, 9.2;

second resilient elements 8.21, 8.22 connecting the intermediate frame 9.1, 9.2 to the support structure 2.1, 2.2;

third resilient elements 10.1, 10.2 (only the resilient elements 10.1 are visible in the figures) connecting the seismic body portions 3.1, 3.2 together;

first transducers 11.1, 11.2 extending between a first side of the support structure 2.1, 2.2 and a facing first side of the intermediate frame 9.1, 9.2;

second transducers 12.1, 12.2 extending between a second side of the support structure 2.1, 2.2 and a facing second side of the intermediate frame 9.1, 9.2, the second side carrying the transducers 12.1 being opposite from the first side carrying the transducers 11.1, and the second side carrying the transducers 12.2 being opposite from the first side carrying the transducers 11.2; and third transducers 13.1, 13.2 (only the transducers 13.1 are visible in the figures) extending between the seismic body portions 3.1 and 3.2.

Figure 3:
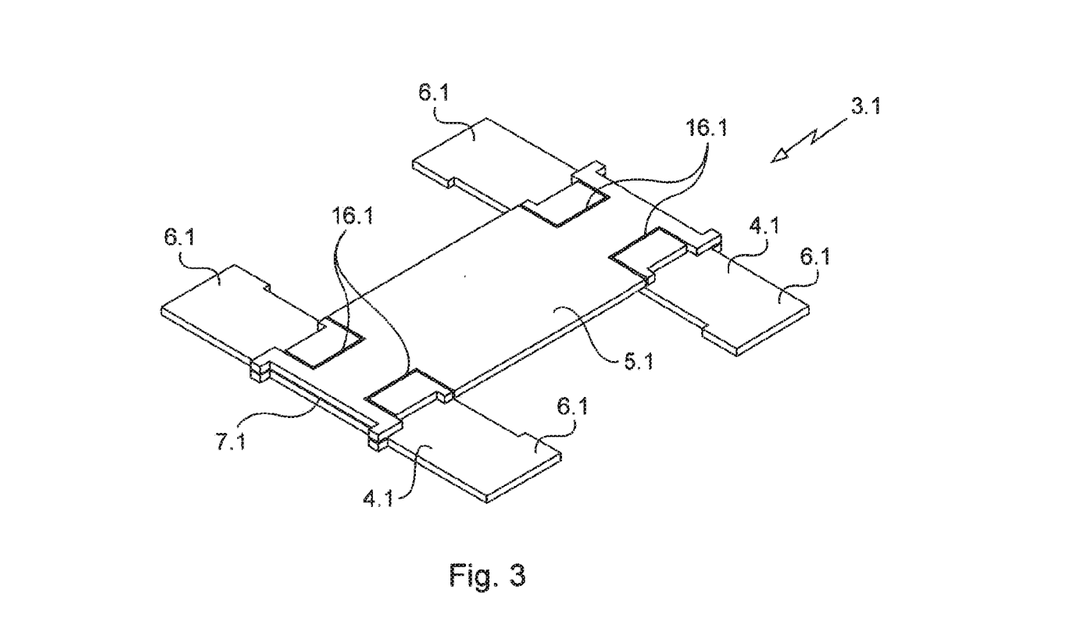
FIG. 3 is a perspective view of one of the seismic bodies of a sensor in a first embodiment of the invention.
Figure 4:
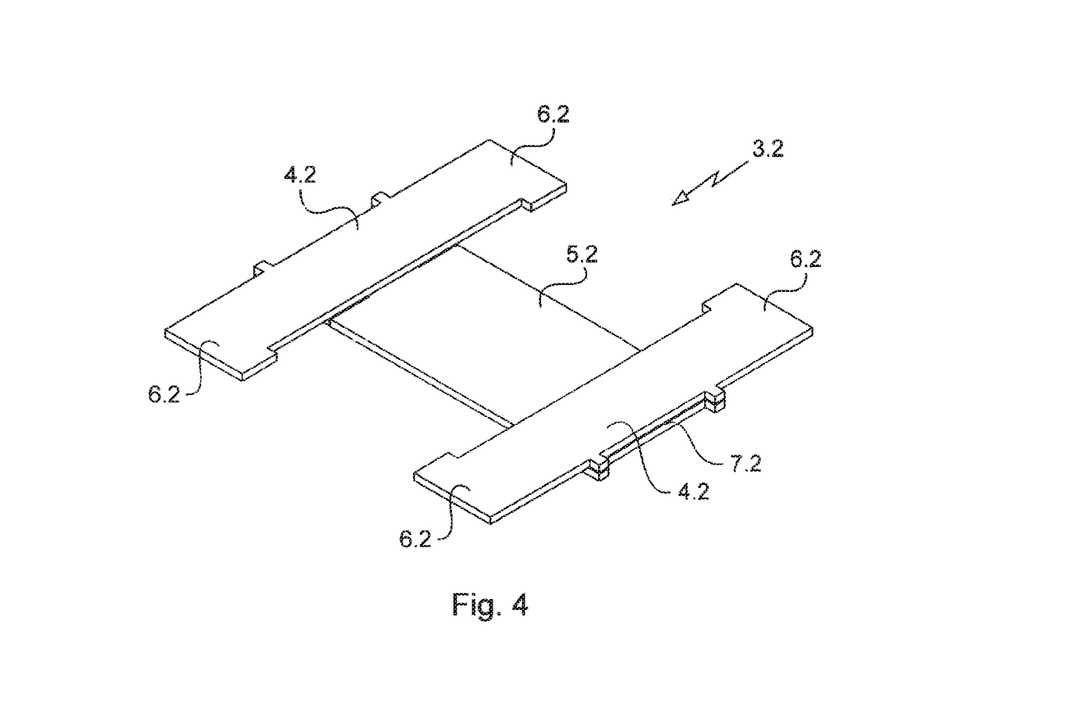
FIG. 4 is a view analogous to FIG. 1 showing the other seismic body of the sensor.

Each seismic body 3.1, 3.2 respectively comprises two wings 4.1, 4.2 in the form of rectangular parallelepipeds extending parallel to each other and spaced apart from each other, being connected together by a central core 5.1, 5.2 in the form of a rectangular parallelepiped that is set back from the wings 4.1, 4.2. The central core 5.1, 5.2 is of width that is less than the spacing between the wings 4.1, 4.2. The wings 4.1 of the seismic body 3.1 are made in the semiconductor layer 100.2 and the central core 5.1 of the seismic body 3.1 is made in the semiconductor layer 100.1. The wings 4.2 of the seismic body 3.2 are formed in the semiconductor layer 100.1 and the central core 5.2 of the seismic body 3.2 is formed in the semiconductor layer 100.2. A portion 7.1, 7.2 of the insulating layer between 100.1 and 100.2 extends between the wings 4.1, 4.2 and the cores 5.1, 5.2 in order to insulate the wings 4.1, 4.2 electrically from the cores 5.1, 5.2.

The seismic bodies 3.1, 3.2 are mounted to move in a predetermined plane P. The seismic bodies 3.1, 3.2 have the same shape and the same mass. The seismic bodies 3.1 and 3.2 are positioned so that their centers of gravity coincide. Each wing 4.1, 4.2 is of mass that is less than half the mass of the core 5.1, 5.2.

The arrangements of the semiconductor layers 100.1, 100.2 are oriented at 90° relative to each other about an axis normal to the predetermined plane P and at 180° about an axis in the predetermined plane P, in such a manner that the core 5.1, 5.2 of each seismic body 3.1, 3.2 extends facing the core 5.2, 5.1 of the other seismic body 3.2, 3.1 and lies between its wings 4.1, 4.2. Thus, the wings 4.1, 4.2 of each of the seismic bodies 3.1, 3.2 have end portions 6.1, 6.2 lying in the same plane as the core 5.1, 5.2 of the other seismic body 3.2, 3.1 and facing the end portions 6.2, 6.1 of the wings 4.2, 4.1 of the other seismic body 3.2, 3.1.

The seismic bodies 3.1, 3.2 thus include mutual engagement means (the wings 4.1, 4.2) in such a manner that the seismic bodies 3.1, 3.2 are mutually nested in each other, while each of them is movable in the predetermined plane P relative to the other seismic body 3.2, 3.1.

The first resilient elements 8.11, 8.12 and the second resilient elements 8.21, 8.22 form a first suspension stage and a second suspension stage for the seismic bodies 3.1, 3.2.

In this example, the resilient elements are formed by strips that are elastically deformable parallel to the suspension plane P, but that present high stiffness along the axis normal to the suspension plane in order to eliminate the degrees of freedom of the seismic bodies 3.1, 3.2 to move out from the suspension plane P. The resilient elements 8.11, 8.12, 8.21, and 8.22 are arranged to provide relatively weak coupling between the intermediate frame 9.1, 9.2 and the seismic bodies 3.1, 3.2 and with the support structure 2.1, 2.2. The first resilient elements 8.11, 8.12 have stiffnesses that are isotropic in the plane P. The second resilient elements 8.21, 8.22 have stiffnesses that are isotropic in the plane P. The stiffnesses of the first resilient elements 8.11, 8.12 and of the second resilient elements 8.21, 8.22 are such that the frequencies of the first resilient mode of the intermediate frame 9.1, 9.2 and of the resilient mode of the set of seismic bodies 3.1; 3.2 are substantially lower than the frequencies of the working modes. The resilient elements 10.1, 10.2 have stiffnesses that are isotropic in the plane P and they are arranged to provide relatively strong coupling between the seismic bodies 3.1, 3.2. The resilient elements 10.1, 10.2 thus present stiffness that is greater than the stiffnesses of the resilient elements 8.11, 8.12, 8.21, 8.22.

Two resilient elements 10.2 extend parallel to the central core 5.1 between each of the wings 4.1 of the seismic body 3.1 and the central core 5.2 of the seismic body 3.2, and two resilient elements 10.1 extend parallel to the central core 5.2 between each of the wings 4.2 of the seismic body 3.2 and the central core 5.1 of the seismic body 3.1.

The transducers 13 are connected to a control unit (not shown) for determining the movements of the seismic bodies 3.1, 3.2 relative to each other.

The transducers 11.1, 11.2 are controlled by the control unit so as to form successively, on a first axis, a detector for detecting movements of the intermediate frame 9.1, 9.2 relative to the support structure 2.1, 2.2 and an actuator for damping the first resonant mode of vibration of the intermediate frame 9.1, 9.2 relative to the support structure 2.1, 2.2.

The transducers 12.1, 12.2 are controlled by the control unit so as to form in succession, on a second axis, a detector of movements of the intermediate frame 9.1, 9.2 relative to the support structure 2.1, 2.2 and an actuator for damping the first resonant mode of vibration of the intermediate frame 9.1, 9.2 relative to the support structure 2.1, 2.2.

The transducers 13.1, 13.2 are controlled by the control unit so as to form in succession an actuator for setting the seismic bodies 3.1, 3.2 into vibration and a detector for detecting the relative movements of the seismic bodies 3.1, 3.2.

Two of the transducers 13.2 extend between each of the wings 4.1 of the seismic body 3.1 and the central core 5.2 of the seismic body 3.2, and two of the transducers 13.1 extend between each of the wings 4.2 of the seismic body 3.2 and the central core 5.1 of the seismic body 3.1. The transducers 13.1 are in the form of two electrodes, e.g. arranged as a comb, which for each electrode are secured one to the wing 4.1, 4.2 and the other to the central core 5.2, 5.1. The electrodes are made integrally with the wings 4.1, 4.2 and with the central core 5.1, 5.2. It should be observed that the portions 7.1, 7.2 of the insulating layer 101.1 make it possible to have wings 4.1, 4.2 and central cores 5.1, 5.2 at different potentials. The transducers are thus arranged in two directions that are parallel to the suspension plane.

The semiconductor layer 100.1, 100.2 has slots 14.1, 14.2 (only the slots 14.1 are visible) at the first and second sides of the support structure 2.1, 2.2 so as to define: a zone A facing each transducer 11.1, 11.2; a zone B on either side of the zone A and facing the second resilient elements 8.21, 8.22; and a zone C between the two zones B.

The semiconductor layer 100.1, 100.2 has slots 15.1, 15.2 (only the slots 15.1 are visible) at the first and second sides of the intermediate frame 9.1, 9.2 to define: a zone B facing each transducer 11.1, 11.2, the second resilient elements 8.21, 8.22, and the first resilient elements 8.11, 8.12; and a zone C between the two zones B.

The semiconductor layer 100.1, 100.2 has slots 16.1, 16.2 around the third resilient elements 10.1, 10.2 to define a zone B facing the first resilient elements 8.11, 8.12 and the transducers 13.1, 13.2.

Each transducer 11 and 12 has an electrode secured to a zone B and an electrode secured to a zone A. Each transducer 13 has an electrode secured to a zone B and an electrode secured to a zone C. In this example, the electrodes form combs. Since the slots 14, 15, 16 extend over the full height of the semiconductor layer 100.1, 100.2, the zones A, B, and C are electrically insulated and can be taken to different potentials in order to transmit control and/or detection signals. Since the semiconductor layers 100.1, 100.2 are separated from each other by the insulating layer 101.1, the zones A, B, and C of the semiconductor layer 100.1 are electrically insulated from the zones A, B, and C of the semiconductor layer 100.2.

The zones A, B, and C serve to conduct a voltage signal between the transducers 11, 12, 13 and the periphery of the support structure 2.1, 2.1. The control unit is electrically connected to the zones A, B, and C via the periphery of the support structure 2.1, 2.2.

In operation, the transducers 13 are controlled so as to perform the following steps in alternation:

setting the assembly comprising the seismic bodies 3.1, 3.2 and the resilient elements 8.11, 8.12, 10.1, 10.2 into vibration at the resonant frequency of the assembly, and maintaining the vibration; and detecting the movements of the seismic bodies 3.1, 3.2 relative to each other. The transducers make it possible to detect relative movements of the seismic bodies 3.1, 3.2 in any direction parallel to the suspension plane.

By way of example, the transducers 11, 12 are controlled so as to create adjustable electrostatic stiffness for the second suspension stage.

Figure 1:
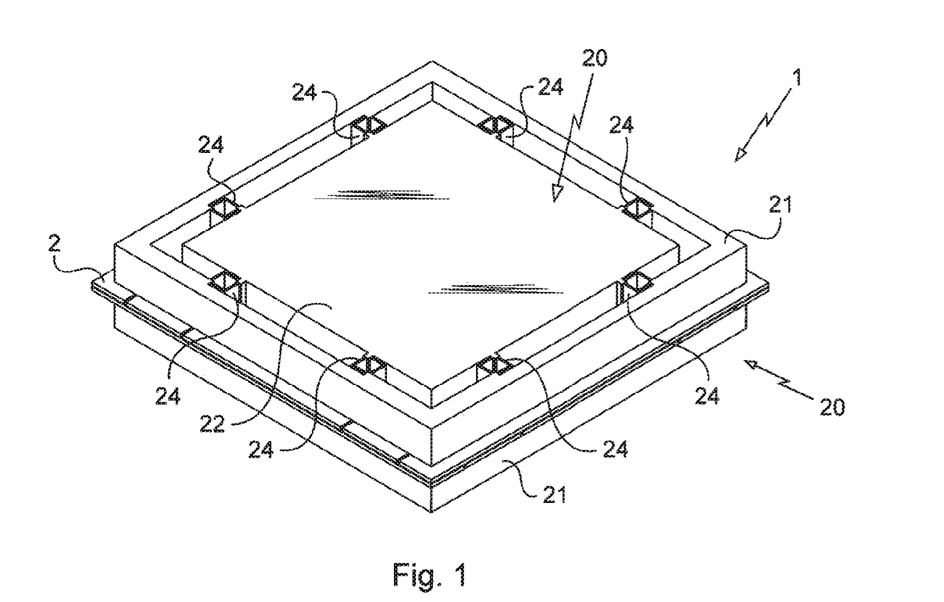
FIG. 1 is a perspective view of the sensor.
Figure 2:
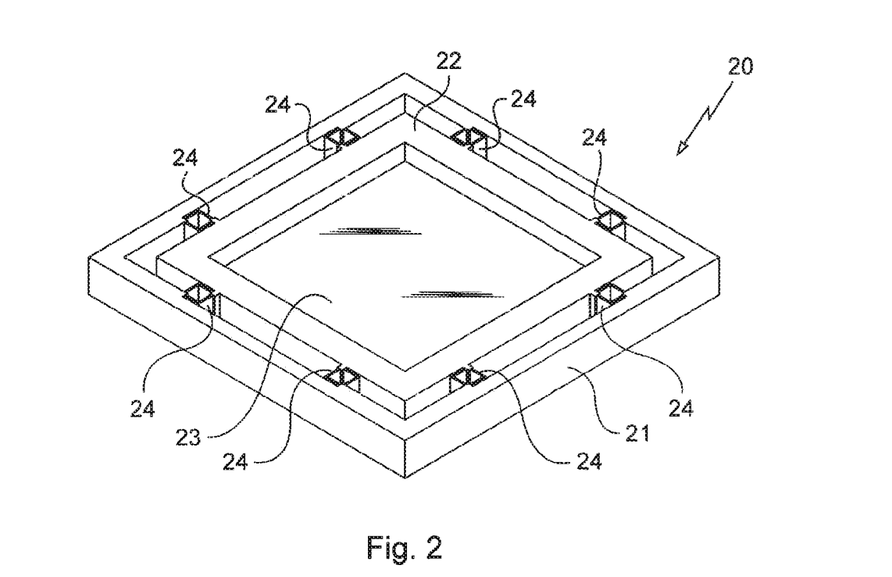
FIG. 2 is a perspective view of a portion of the package of the sensor.
Figure 5:
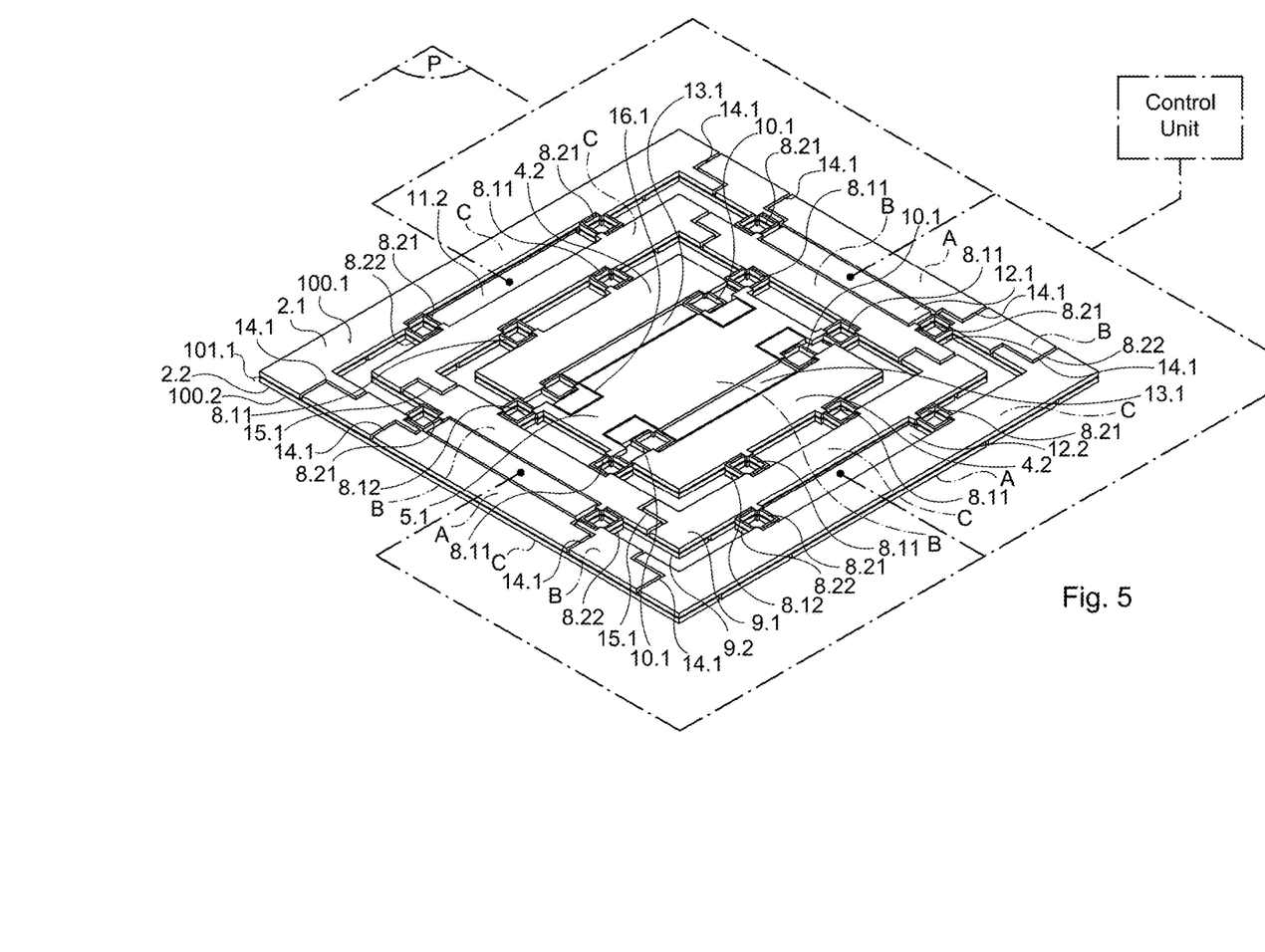
FIG. 5 is a perspective view of the sensor in the package.

The sensor may have a package formed by two portions given overall reference 20, between which the assembly comprising the support structure 2.1, 2.2, the intermediate frame 9.1, 9.2, and the seismic bodies 3.1, 3.2 is held captive (together with the associated transducers and resilient means). Each portion 20 comprises a frame 21 secured to the support structure 1 and a cover 22 secured to the intermediate frame 9.1, 9.2 and connected to the frame 21 by resilient means 24. The cover 22 of each portion 20 has a cavity 23 facing the seismic bodies 3.1, 3.2. The covers 22 are fastened on the support frame 9 in such a manner that the cavities 23 can be evacuated. The cover 22 is of sufficient mass to constitute a recoil mass for the resonant modes of the seismic bodies 3.1, 3.2 serving to separate the frequencies of the working modes and of the suspension modes created by the second resilient elements 8.21, 8.22 and at least to attenuate a fraction of the interfering forces coming from the outside.

Since the seismic bodies are identical in shape and size, and since their centers of gravity coincide, the seismic bodies have the same inertia and form a balanced resonator that does not transmit energy to the outside at the frequency of the working mode and that is not subject to the influence of external vibratory effects. This contributes to stabilizing the damping anisotropy, with the performance of the sensor being improved in correspondence with the stability of this anisotropy.

The sensor of the invention is obtained at least in part by means of a fabrication method including a stage of etching crystal material.

The fabrication method comprises a step of etching the sensor in the wafer having the two semiconductor layers 100.1, 100.2 and the insulating layer 101.1.

The seismic bodies 3.1, 3.2 (wings 4.1 and 4.2, central cores 5.1 and 5.2, insulating layers 7.1, 7.2), the support structures 2.1, 2.2, the intermediate frames 9, the resilient elements 8.11, 8.12, 8.21, 8.22, 10.1, and 10.2, the transducers 11.1, 11.2, 12.1, 12.2, 13.1, 13.2, and the slots 14, 15, 16 are obtained directly by etching.

Each of the package portions 20 is likewise obtained by etching a crystal material.

In general manner, recourse is also had to conventional MEMS technologies referred to generically as "wafer bonding". In the present example, mention may be made of techniques known as "direct bonding", anodic bonding", and "metallic bonding".

Figure 6:
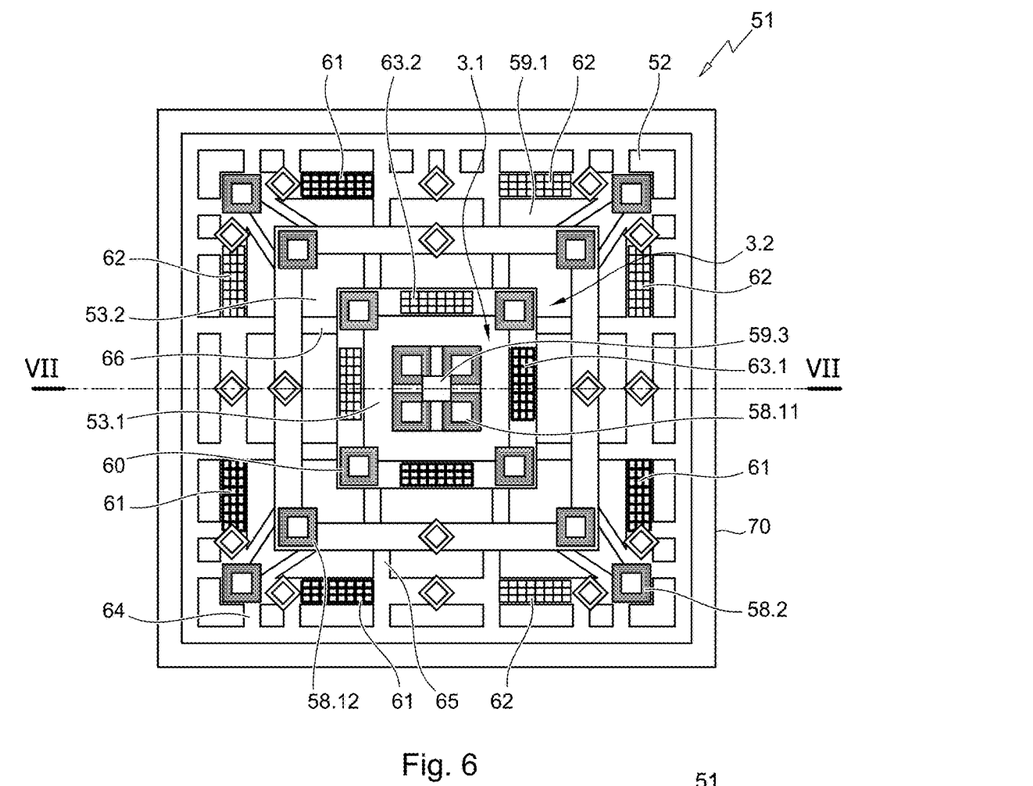
FIG. 6 is a plan view of a sensor in a second embodiment, with the package removed.
Figure 7:
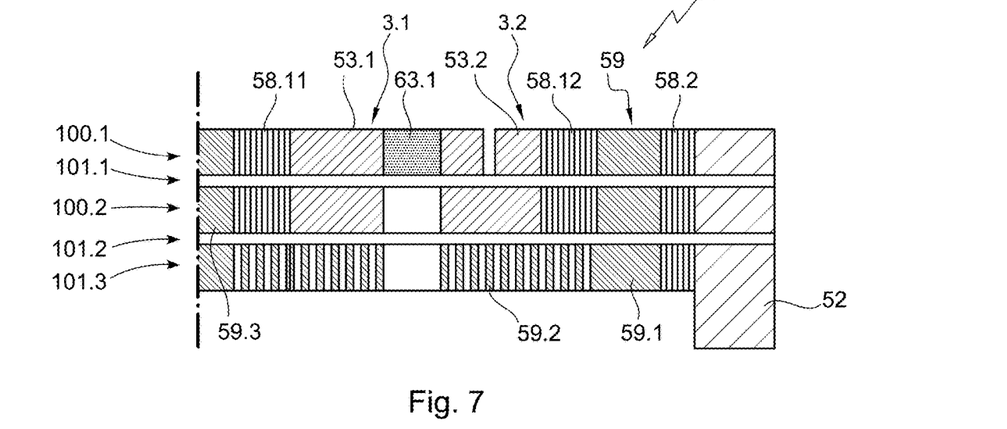
FIG. 7 is a section view of the sensor on line VII-VII of FIG. 6.

With reference to FIGS. 6 and 7, and in a second embodiment, the sensor, given overall reference 51, is a MEMS type sensor made using a wafer having three semiconductor layers 100.1, 100.2, and 100.3 and two electrically insulating layers 101.1 and 101.2. The first insulating layer 101.1 extends between the first semiconductor layer 100.1 and the second semiconductor layer 100.2; the insulating layer 101.2 extends between the second semiconductor layer 100.2 and the third semiconductor layer 100.3. The semiconductor layers 100.1, 100.2, and 100.3 are made of semiconductor material, silicon in this example, and the insulating layers 101.1, 101.2 are made of a silicon oxide such as $SiO_2$.

The sensor 51 comprises:

a support structure 52 forming an outer frame;

an intermediate frame 59 having a margin 59.1 projecting from a bottom 59.2 having a stud 59.3 extending from its center;

seismic bodies 53.1, 53.2 arranged in the form of concentric frames, the seismic body 53.1 extending between the seismic body 53.2 and the stud 59.3;

first resilient elements 58.11 connecting the seismic body 53.1 to the central stud 59.3 of the intermediate frame 59;

first resilient elements 58.12 connecting the seismic body 53.2 to the margin 59.1 of the intermediate frame 59;

second resilient elements 58.2 connecting the intermediate frame 59 to the support structure 52;

third resilient elements 60 connecting the seismic bodies 53.1, 53.2 to each other;

first transducers 61 each extending between one of the sides of the support structure 52 and a facing one of the sides of the intermediate frame 59;

second transducers 62 each extending between one of the sides of the support structure 52 and a facing one of the sides of the intermediate frame 59;

third transducers 63.1 extending between facing sides of the seismic bodies 3.1, 3.2 the sensor having two third transducers 63.1 arranged on two adjacent sides; and third transducers 63.2 extending between the facing sides of the seismic bodies 3.1, 3.2, the sensor comprising two third transducers 63.2 arranged on two adjacent sides.

The support structure 52 is formed by etching all of the layers; the bottom 59.2 is formed solely in the semiconductor layer 101.3; the margin 59.1 and the stud 59.3 are formed in the layers 100.1, 101.1, 100.2, 101.2; the seismic bodies 53.1, 53.2 are formed in the layers 100.1, 100.2, 101.1; the first and second resilient elements are formed in the layers 100.1, 100.2, 101.1; and the third resilient elements are formed in the semiconductor layers 100.1, 100.2, 101.1. The insulating layer 101.2 is partially eliminated in order to avoid impeding the movements of the seismic bodies 53.1, 53.2 and of the resilient elements relative to the bottom 59.2.

As above, the seismic bodies 3.1, 3.2 have the same mass and they are positioned to have their centers of gravities coinciding with each other. The seismic bodies are movable relative to the intermediate frame 59 and to the support structure 52 in a suspension plane P.

The first resilient elements 58.11, 58.12 and the second resilient elements 58.2 form a first suspension stage and a second suspension stage for the seismic bodies 53.1, 53.2.

In this example, the resilient elements are formed by strips that are elastically deformable parallel to the suspension plane P, but that present high stiffness along the axis normal to the suspension plane in order to eliminate the degrees of freedom of the seismic bodies 53.1, 53.2 to move out from the suspension plane P. The resilient elements 58.11, 58.12, 58.2 are arranged to provide the intermediate frame 59 with relatively weak coupling with the seismic bodies 53.1, 53.2 and with the support structure 52. The first resilient elements 58.11, 58.12 have stiffnesses that are isotropic in the plane P. The second resilient elements 58.2 have differences that are isotropic in the plane P. The stiffnesses of the first resilient elements 58.11, 58.12 and of the second resilient element 58.2 are such that the frequencies of the first resonant mode of the intermediate frame 59 and of the resonant mode of the set of seismic bodies 53.1, 53.2 are substantially lower than the frequencies of the working modes. The resilient elements 60 have stiffnesses that are isotropic in the plane P and they are arranged to provide relatively strong coupling between the seismic bodies 53.1, 53.2. The resilient elements 60 thus have stiffness greater than the stiffness of the resilient elements 58.11, 58.12, 58.2.

The transducers 61, 62, 63.1, 63.2 are connected to a control unit (not shown) in order to determine the movements of the seismic bodies 53.1, 53.2 relative to each other.

The transducers 61 are controlled by the control unit to move the intermediate frame 59 relative to the support structure 52. The transducers 62 are controlled by the control unit in order to detect the movements of the intermediate frame 59 relative to the support structure 52.

The transducers 63.1 are controlled by the control unit so as to form an actuator for setting the seismic bodies 53.1, 53.2 into vibration, and the transducers 63.2 are controlled by the control unit so as to form a detector for detecting relative movements of the seismic bodies 53.1, 53.2.

As in the first embodiment, the semiconductor layer 100.1 and/or the layers 100.1, 101.1 are provided over the full height of slots 64, 65, 66 frame in the support structure 52, the margin 59.1 of the intermediate frame 59, and in the seismic body 53.2 in order to enable conduction zones to be formed therein that are subjected to different potentials. Some or all of the resilient elements are used for interconnecting zones belonging to the support structure 52, the intermediate frame 59, and the seismic bodies 53.1, 53.2 that are to be at the same potential.

Each of the transducers 61, 62, 63.1, 63.2 then has an electrode secured to one conduction zone and another electrode secured to another conduction zone. These various conduction zones are electrically insulated from one another and can thus be raised to different potentials in order to transmit control and/or detection signals.

The conduction zones as defined in this way serve to conduct voltage signals between the transducers 61, 62, 63.1, 63.2 and the periphery of the support structure 52. The control unit is electrically connected to said conduction zones at the periphery of the support structure 52.

The assembly is mounted in a package 70.

Naturally, the invention is not limited to the embodiments described but covers any variant coming within the ambit of the invention as defined by the claims.

In particular, the sensor may have more than two seismic bodies and the seismic bodies may be of a shape different from that described.

Figure 8:
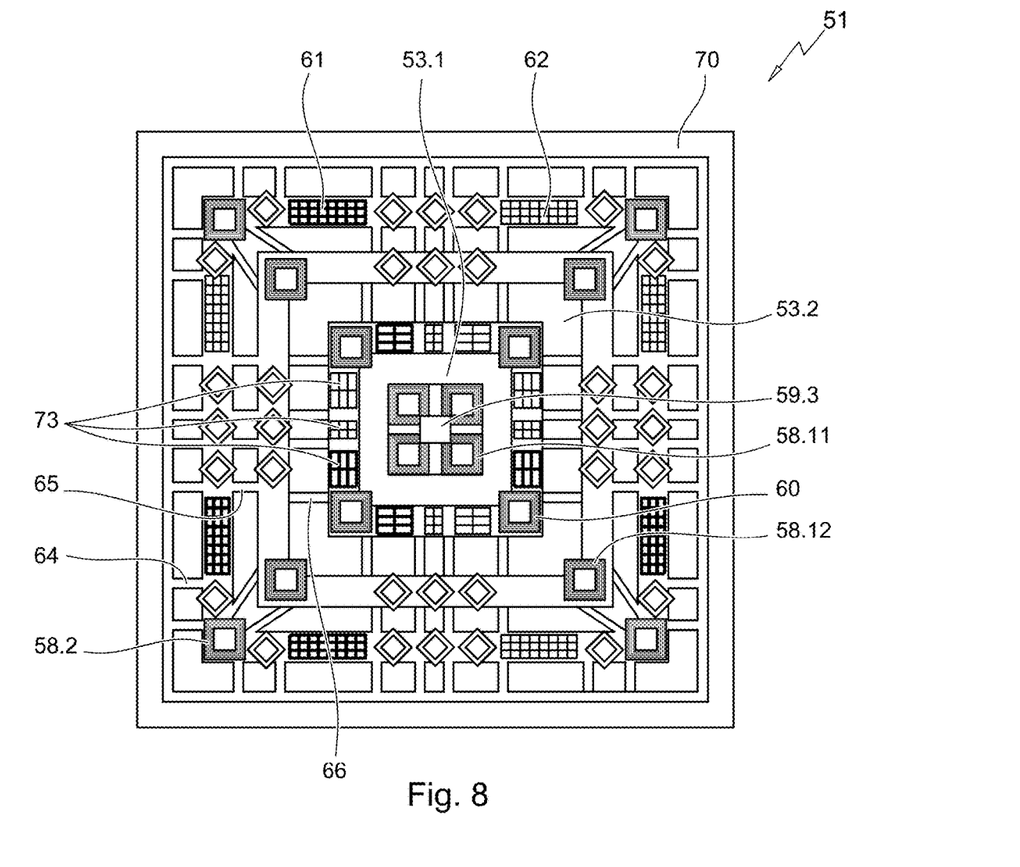
FIG. 8 is a view analogous to FIG. 6 showing a variant of the second embodiment.

The number of transducers may be different from that described. For example, with reference to FIG. 8, it is possible to provide three transducers 73 per side of the seismic bodies 53.1, 53.2 instead of only one as shown in FIG. 7. The number of conduction zones is then greater, as is the number of slots. Provision is then made for additional deformable elements for connecting zones belonging to different components (support structure, intermediate frame, seismic bodies) but that need to be at the same electric potential. The deformable elements may be arranged to contribute significantly to suspension or not at all.

In a variant, the transducer 11.1 may be controlled as a detector only and the transducer 12.1 may be controlled as an actuator only, or vice versa. The same applies for the transducers 11.2, 12.2.

The sensor need not have a package 20.

The invention claimed is:

1. A MEMS type inertial sensor comprising:
a support structure having at least a first seismic body and a second seismic body connected thereto by resilient means in order to be movable in a suspension plane;
transducers for maintaining the seismic bodies in vibration and for determining movements of the seismic bodies in the suspension plane; and
a control unit connected to the transducers by electrical conductor means,
wherein the transducers have electrodes secured respectively to the first seismic body and to the second seismic body, said electrodes secured respectively to the first seismic body and to the second seismic body cooperating together to make it possible to measure directly movements of the seismic bodies relative to each other in the suspension plane, in at least two directions parallel to the suspension plane.

2. A sensor according to claim 1, further comprising:
at least a first semiconductor layer in which there are formed at least a portion of the seismic bodies, the resilient means, and the electrodes;
a first electrically insulating layer; and
a second semiconductor layer forming a support,
wherein the first semiconductor layer is provided with slots through its full height in order to define electrical conduction paths extending from the electrodes to the periphery of the support structure via the resilient means so as to form at least some of the conduction means.

3. A sensor according to claim 2, further comprising a second insulating layer and a third semiconductor layer, the second semiconductor layer extending between the insulating layers and an intermediate support frame being formed in the second semiconductor layer, the third semiconductor layer forming a support structure.

4. A sensor according to claim 3, wherein the seismic bodies are concentric, the first seismic body being mounted in the second seismic body and including a central cavity in which there extends a stud secured to the third semiconductor layer, and the first seismic body is connected to the stud by resilient means.

5. A sensor according to claim 1, wherein the seismic bodies are of the same shape and have the same mass, and in that the seismic bodies include mutual engagement portions in such a manner that the seismic bodies are nested in one another while being movable in the suspension plane relative to one another, the seismic bodies having centers of gravity that coincide.

6. A sensor according to claim 5, wherein each seismic body has two wings in the form of rectangular parallelepipeds that extend parallel to each other and that are connected together by a central core in the form of a rectangular parallelepiped that is set back from the wings, the seismic bodies being oriented at 90° relative to each other about an axis normal to the suspension plane and at 180° about an axis in the suspension plane in such a manner that the core of each seismic body extends facing the core and between the wings of the other seismic body, and the wings of each seismic body have end portions extending in the same plane as the core and facing end portions of the wings of the other seismic body.

7. A sensor according to claim 6, wherein each wing is of mass that is less than half the mass of the core.

* * * * *